United States Patent
Shim

(10) Patent No.: US 7,867,808 B2
(45) Date of Patent: Jan. 11, 2011

(54) IMAGE SENSOR AND METHOD FOR MANUFACTURING THE SAME

(75) Inventor: Hee-Sung Shim, Gangneung-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 58 days.

(21) Appl. No.: 12/344,538

(22) Filed: Dec. 28, 2008

(65) Prior Publication Data

US 2009/0166779 A1 Jul. 2, 2009

(30) Foreign Application Priority Data

Dec. 28, 2007 (KR) ...................... 10-2007-0139749

(51) Int. Cl.
- *H01L 21/30* (2006.01)
- *H01L 21/46* (2006.01)
- *H01L 21/425* (2006.01)

(52) U.S. Cl. .............................. 438/66; 438/67; 438/91; 438/459; 438/514; 257/E21.545

(58) Field of Classification Search .................. 438/66, 438/67, 91, 459, 514; 257/E21.545
See application file for complete search history.

(56) References Cited

U.S. PATENT DOCUMENTS

| | | | |
|---|---|---|---|
| 6,001,664 A * | 12/1999 | Swirhun et al. ............... | 438/31 |
| 6,852,565 B1 | 2/2005 | Zhao | |
| 6,960,757 B2 | 11/2005 | Merrill et al. | |
| 7,005,689 B2 * | 2/2006 | Song et al. ................... | 257/290 |
| 7,687,837 B2 * | 3/2010 | Park et al. .................... | 257/294 |
| 2005/0045925 A1 * | 3/2005 | Yoshida et al. .............. | 257/291 |
| 2005/0062084 A1 | 3/2005 | Han | |
| 2005/0127462 A1 | 6/2005 | Rim et al. | |
| 2006/0214249 A1 * | 9/2006 | Nam et al. ................... | 257/432 |

FOREIGN PATENT DOCUMENTS

| | | |
|---|---|---|
| CN | 1630089 | 6/2005 |
| CN | 1820349 | 8/2009 |
| KR | 10-2005-0117674 | 12/2005 |

* cited by examiner

*Primary Examiner*—Ngan Ngo
(74) *Attorney, Agent, or Firm*—Sherr & Vaughn, PLLC

(57) ABSTRACT

Embodiments relate to an image sensor and a method of manufacturing an image sensor. According to embodiments, an image sensor may include a first substrate, a photodiode, and an ion implantation isolation layer. According to embodiments, circuitry including a metal interconnection may be disposed over the first substrate. A photodiode may be provided in a crystalline semiconductor layer bonded to the first substrate, and electrically connected to the metal interconnection. The ion implantation isolation layer may be provided in the photodiode.

9 Claims, 5 Drawing Sheets

US 7,867,808 B2

IMAGE SENSOR AND METHOD FOR MANUFACTURING THE SAME

Figure 1:
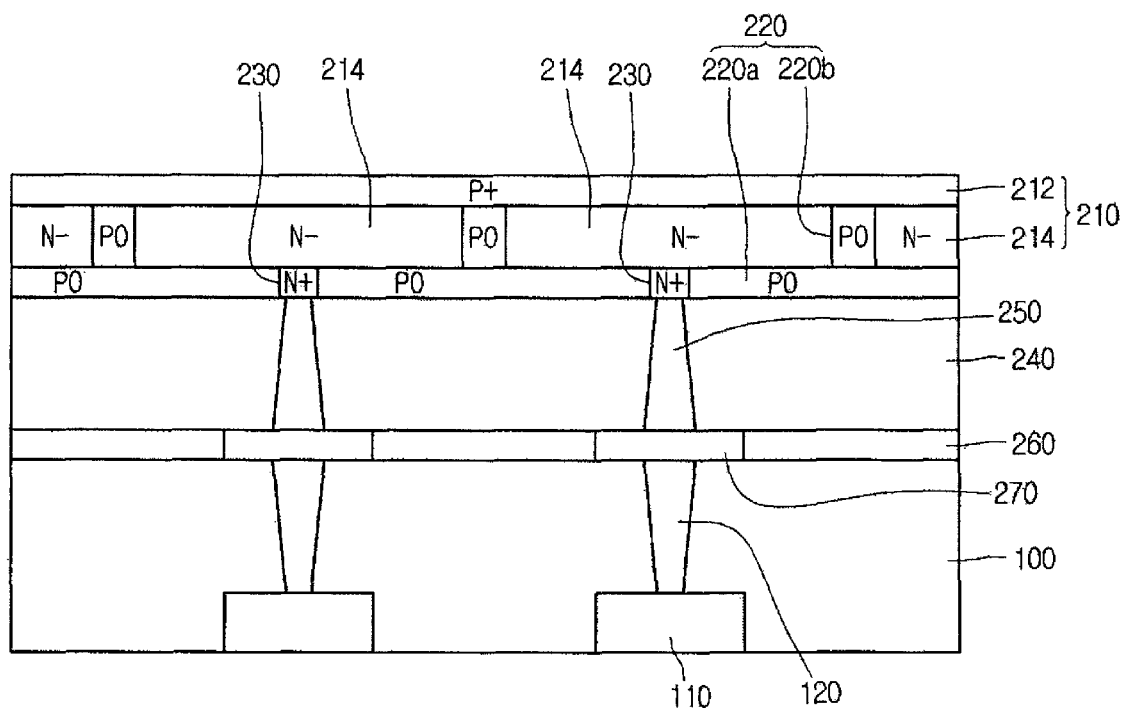
Figure 2:
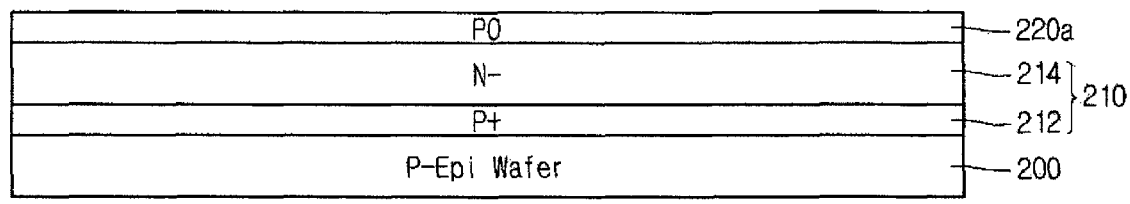

The present application claims priority under 35 U.S.C. 119 to Korean Patent Application No. 10-2007-0139749 (filed on Dec. 28, 2007), which is hereby incorporated by reference in its entirety.

BACKGROUND

An image sensor may be a semiconductor device that converts an optical image into an electrical signal. Image sensors may be classified into categories, such as a charge coupled device (CCD) image sensor and a complementary metal oxide silicon (CMOS) image sensor (CIS).

A CIS may include a photo diode and a MOS transistor formed in a unit pixel. A CIS may obtain an image by sequentially detecting electrical signals of unit pixels in a switching manner. In a CIS structure, a photo diode region may convert a light signal to an electrical signal, and a transistor may process the electrical signal. A CMOS image sensor may include a photodiode and a MOS transistor within a unit pixel to sequentially detect electrical signals of each unit pixel, implementing an image. A photo diode region and a transistor may be horizontally arranged in a semiconductor substrate.

In a horizontal type CIS according to the related art, a photo diode and a transistor may be horizontally formed adjacent to each other on and/or over a substrate. Therefore, an additional region for forming a photo diode may be required.

Also, in a related art horizontal type CIS, it may be difficult to achieve an optimized process of concurrently forming a photodiode and a transistor. That is, a shallow junction may be required to meet low sheet resistance in a rapid transistor process, but such a shallow junction may not be suitable for a photodiode.

Further, in a related art horizontal type CIS, extra on-chip functions may be added to an image sensor. Thus, a unit pixel size may need to be increased to maintain a sensitivity of an image sensor or an area for a photodiode may need to be decreased to maintain a pixel size. However, if a pixel size increases, a resolution of an image sensor may decreases. If an area of a photodiode decreases, a sensitivity of an image sensor may become poor.

SUMMARY

Embodiments relate to an image sensor and a manufacturing method thereof that may provide a vertical integration of circuitry and a photodiode. Embodiments relate to an image sensor and a manufacturing method thereof that may prevent a dark current in a vertical type photodiode having a crystalline structure.

Embodiments relate to an image sensor and a manufacturing method thereof that may implement a vertical type photodiode, which may improve bondability and an alignment margin between substrates. Embodiments relate to an image sensor and a manufacturing method thereof that may enhance resolution and sensitivity.

Embodiments relate to an image sensor and a manufacturing method thereof that may implement a vertical type photodiode, which may prevent generation of defects in the photodiode.

According to embodiments, an image sensor may include at least one of the following. A first substrate on and/or over which circuitry including a metal interconnection may be formed. A photodiode in a crystalline semiconductor layer bonded to the first substrate, where the photodiode may be electrically connected to the metal interconnection. An ion implantation isolation layer in the photodiode.

According to embodiments, a method for manufacturing an image sensor may include at least one of the following. Forming circuitry including a metal interconnection on and/or over a first substrate. Forming a photodiode in a crystalline semiconductor layer of a second substrate. Forming an ion implantation isolation layer in the photodiode. Bonding the first and second substrates to each other, which may connect the photodiode to the metal interconnection. Removing a lower portion of the second substrate to expose the photodiode.

DRAWINGS

Example FIGS. 1 through 8 illustrate an image sensor and a method for manufacturing an image sensor, according to embodiments.

DESCRIPTION

An image sensor and a method for manufacturing an image sensor according to embodiments will be described with reference to the accompanying drawings.

Example FIG. 1 is a sectional view of an image sensor, according to embodiments. Referring to example FIG. 1, an image sensor may include first substrate 100 on and/or over which circuitry including a metal interconnection may be formed. According to embodiments, photodiode 210 may be disposed in a crystalline semiconductor layer, which may be bonded to first substrate 100, and may be electrically connected to the metal interconnection. Ion implantation isolation layer 220 may be provided in photodiode 210.

According to embodiments, photodiode 210 may include second conduction type conduction layer 212 in the crystalline semiconductor layer and first conduction type conduction layer 214 on and/or over second conduction type conduction layer 212. According to embodiments, defects in a photodiode may be minimized or prevented by implementing a vertical type photodiode in which a photodiode may be positioned over circuitry. According to embodiments, photodiode 210 may be formed in a crystalline semiconductor layer.

According to embodiments, ion implantation layer 220 may include second conduction type second ion implantation isolation layer 220b, which may be disposed at an interface between pixels of photodiode 210. According to embodiments, ion implantation isolation layer 220 may include second conduction type first ion implantation isolation layer 220a, which may be disposed under and/or below first conduction type conduction layer 214.

According to embodiments, a side and/or the bottom of photodiode 210, which may be lightly doped with n-type impurities, may be insulated using an ion implantation isolation layer. This may achieve pixel-to-pixel isolation. According to embodiments, an ion implantation isolation layer may be P0 layer 220. According to embodiments, ion implantation isolation layer 220 may be used instead of using a related art shallow trench isolation (STI) process. According to embodiments, dark current that may be caused by crystal defects that may be generated during an etching process may be minimized.

According to embodiments, an image sensor may further include second dielectric 260 under photodiode 210 and metal pad 270 in second dielectric 260. According to embodiments, in manufacturing an image sensor implementing a vertical type photodiode, substrates may be bonded after forming dielectric 260 and metal pad 270. This may improve a bondability and an alignment margin between substrates.

A method for manufacturing an image sensor according to embodiments will be described with reference to example FIGS. 2 through 8. Referring to example FIG. 2, photodiode 210 may be formed in a crystalline semiconductor layer of second substrate 200. According to embodiments, since photodiode 210 may be formed in a crystalline semiconductor layer, defects inside a photodiode may be minimized or prevented.

According to embodiments, second substrate 200 may be formed by an epitaxial growth method. According to embodiments, hydrogen ions may be implanted into an interface between second substrate 200 and a crystalline semiconductor layer. This may form a hydrogen ion implantation layer. According to embodiments, hydrogen ions may be implanted after implanting impurity ions for formation of photodiode 210.

According to embodiments, impurity ions may be implanted into a crystalline semiconductor layer. This may form photodiode 210. According to embodiments, second conduction type conduction layer 212 may be formed in a lower portion of a crystalline semiconductor layer. Second conduction type conduction layer 212 may be a high concentration P-type conduction layer. According to embodiments, high concentration P-type conduction layer 212 may be formed in a lower portion of a crystalline semiconductor layer. According to embodiments, this may be done by performing a first blanket-ion implantation on and/or over an entire surface of second substrate 200 without a mask. According to embodiments, second conduction type conduction layer 212 may be formed at a junction depth of less than approximately 0.5 µm.

According to embodiments, first conduction type conduction layer 214 may be formed on and/or over second conduction type conduction layer 212, for example by performing a second blanket-ion implantation on and/or over an entire surface of second substrate 200 without a mask. According to embodiments, first conduction type conduction layer 214 may be a low concentration N-type conduction layer. According to embodiments, low concentration first conduction type conduction layer 214 may be formed at a junction depth ranging from approximately 1.0 µm to approximately 2.0 µm.

According to embodiments, a method for manufacturing an image sensor may also include forming second conduction type first ion implantation isolation layer 220a on and/or over first conduction type conduction layer 214. According to embodiments, ion implantation may be performed without a mask, which may form second conduction type first ion implantation isolation layer 220a. According to embodiments, this may be first P0 layer 220a.

Figure 3:
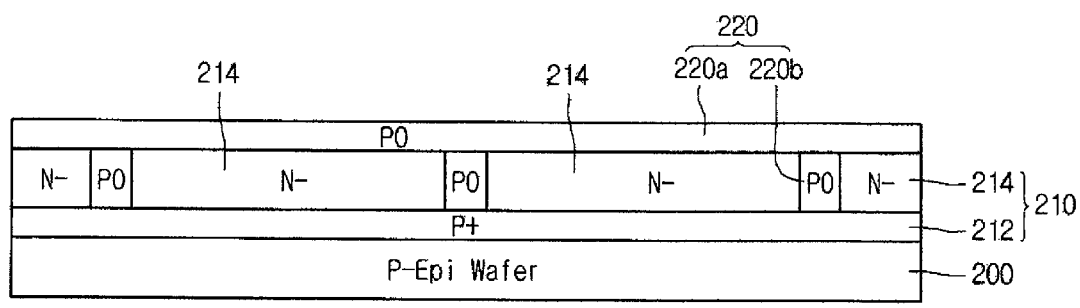

Referring to example FIG. 3, second conduction type second ion implantation isolation layer 220b may be formed at an interface between pixels of photodiode 210. According to embodiments, second P0 layer 220b may be formed at an interface between pixels using a photolithographic process and an ion implantation process. Second P0 layer 220b may be used for pixel-to-pixel isolation of N− layer 214, which may be first conduction type conduction layer 214, used as the photodiode, and may also be used for a ground line connection.

Figure 4:
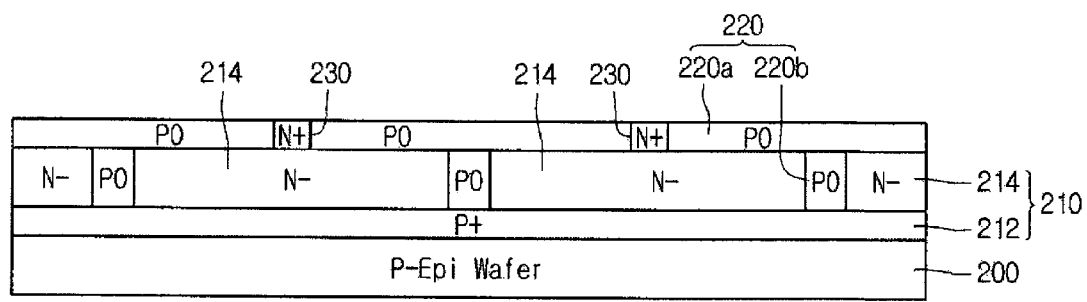

Referring to example FIG. 4, high concentration first conduction type ion implantation region 230 may be selectively formed. According to embodiments, first conduction type conduction layer 214 may be connected to second conduction type first ion implantation isolation layer 220a. According to embodiments, N+ layer 230 may be formed using a photolithographic process and an ion implantation process. N− layer 214 may act as photodiode 210. According to embodiments, first P0 layer 220a and second P0 layer 220b may serve as a pixel-to-pixel isolator and a ground line. According to embodiments, N+ layer 230 may serve as an electron movement path of electrons generated from pixels, and may contribute to ohmic contact.

Figure 5:
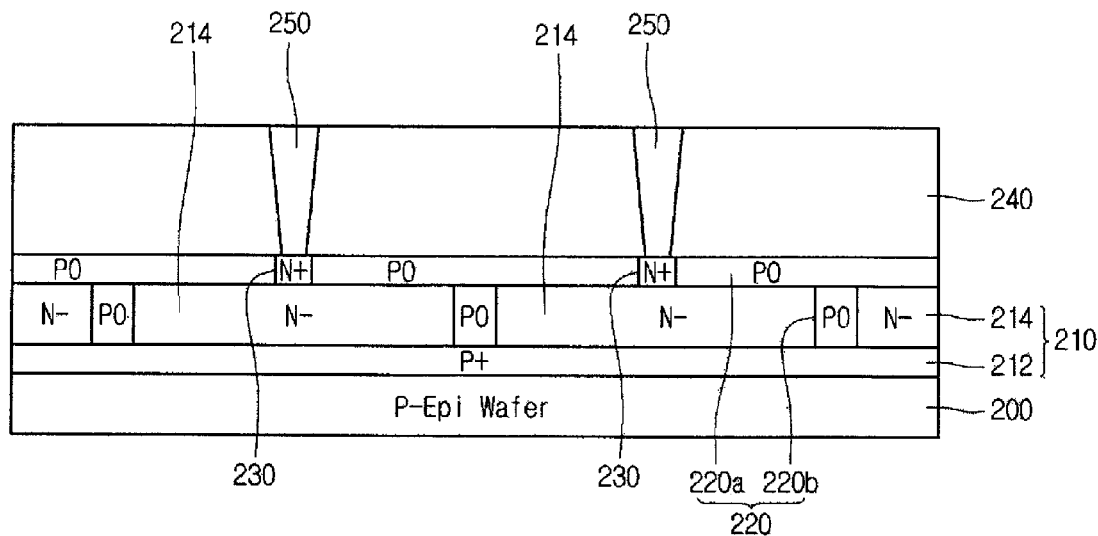

Referring to example FIG. 5, first dielectric 240 may be formed on and/or over second substrate 200. According to embodiments, metal plug 250 may then be formed. According to embodiments, an oxide layer may be formed on and/or over second substrate 200. According to embodiments, metal plug 250 may be formed of tungsten, but may not be limited thereto.

Figure 6:
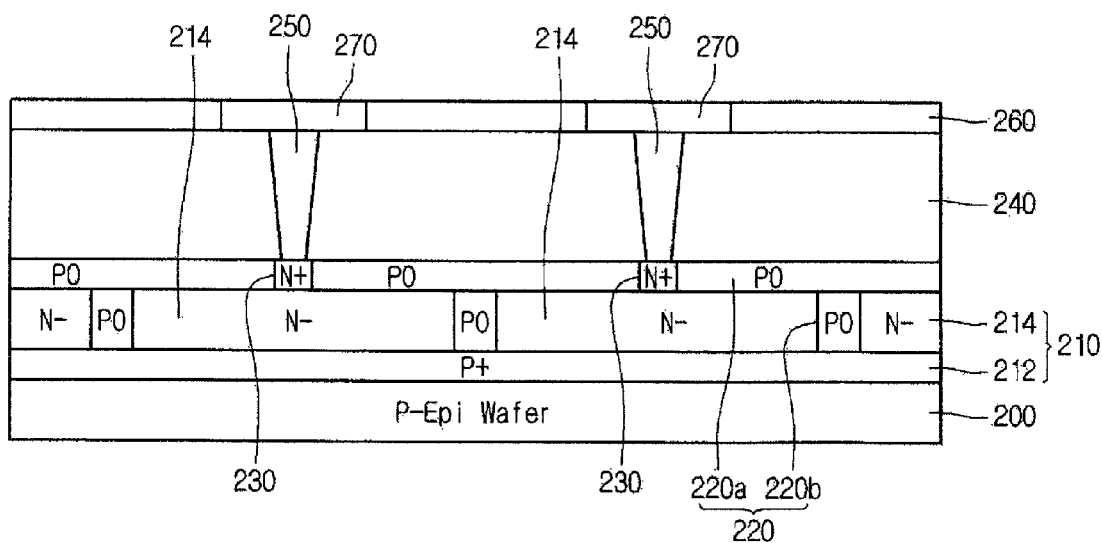

Referring to example FIG. 6, second dielectric 260 may be formed on and/or over photodiode 210 of second substrate 200. According to embodiments, metal pad 270 may be formed in second dielectric 260. According to embodiments, in manufacturing an image sensor implementing a vertical type photodiode, substrates may be bonded after forming dielectric 260 and metal pad 270. This may improve a bondability and an alignment margin between the substrates. According to embodiments, metal pad 270 may be formed of tungsten (W), aluminum (Al), copper (Cu), or the like.

Figure 7:
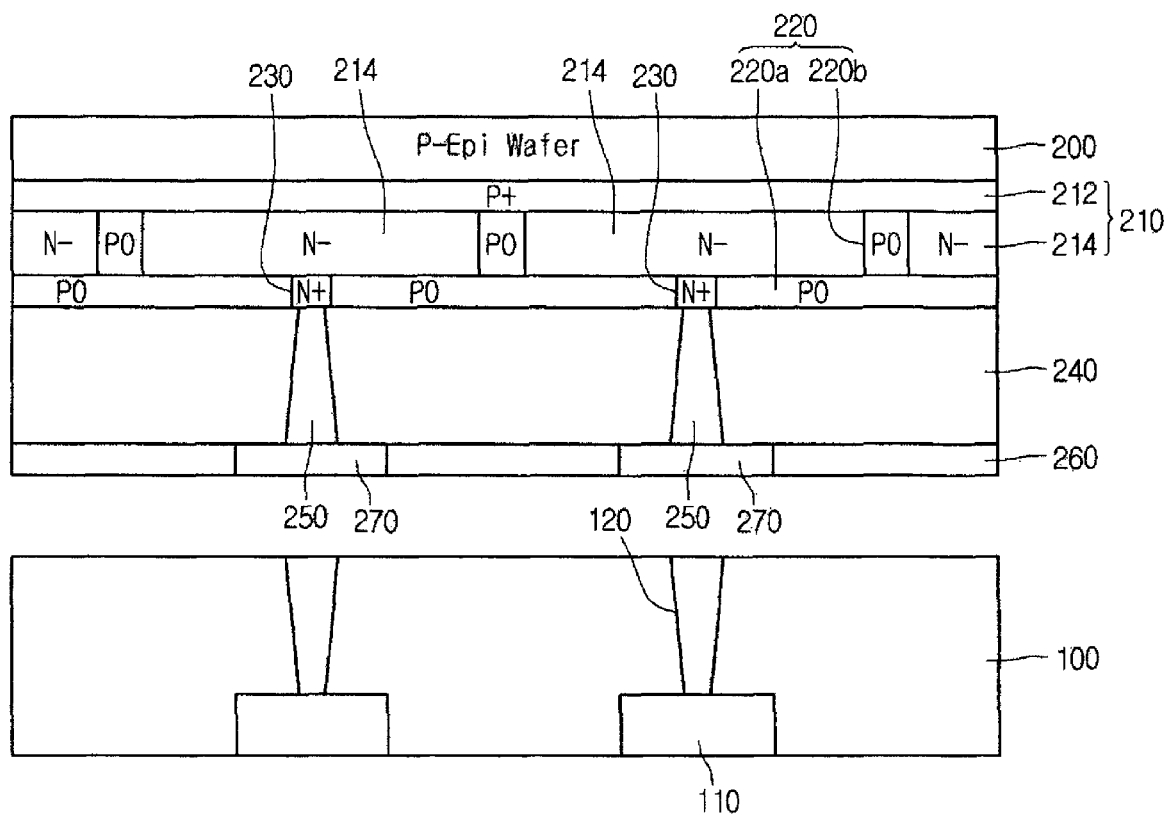

Referring to example FIG. 7, first substrate 100, which may include a metal interconnection and circuitry, may be prepared. According to embodiments, first substrate 100 may be bonded to second substrate 200 through a wafer-level bonding. A metal interconnection of first substrate 100 may include metal 110 and plug 120.

According to embodiments, bonding may be performed by contacting first substrate 100 and second substrate 200 with each other and then performing activation by plasma. According to embodiments, this may increase a surface energy in a bonding surface.

Figure 8:
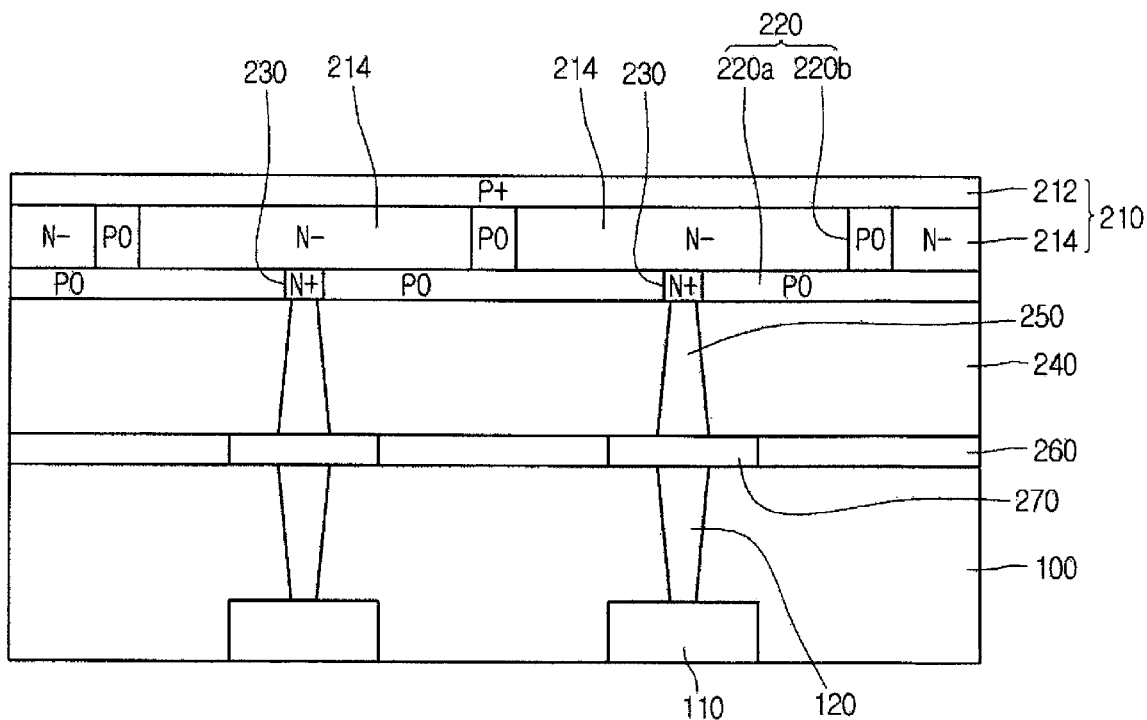

Referring to example FIG. 8, hydrogen ion implantation layer, which may be formed in second substrate 200, may be changed into a hydrogen gas layer. According to embodiments, this may be done by performing heat treatment to second substrate 200. According to embodiments, a portion of second substrate 200 may then be removed. According to embodiments, photodiode 210 may remain under a hydrogen gas layer. This may expose photodiode 210. According to embodiments, second substrate 200 may be removed using a cutting apparatus, such as a blade.

According to embodiments, P-Epitaxial layer, which may be at an upper portion of second substrate 200, may be removed by performing a cleaving or backside thinning process after bonding the first and second substrates. According to embodiments, an uppermost layer of photodiode 210, which may be P+ layer 212, may be connected to a ground line during a subsequent process.

According to embodiments, an image sensor and method for manufacturing the same may provide vertical integration of circuitry and a photodiode. According to embodiments, to achieve pixel-to-pixel isolation, portions of a photodiode lightly doped with n-type impurities may be insulated from each other using a P0 layer instead of implementing a related art STI process. According to embodiments, it may be possible to minimize a dark current that may be caused by crystal defects that may be generated during an etching process.

According to embodiments, in manufacturing an image sensor implementing a vertical type photodiode, substrates may be bonded after forming a dielectric and a metal pad. This may improve a bondability and an alignment margin between the substrates.

According to embodiments, vertical integration of circuitry and a photodiode may make it possible to obtain a fill factor close to 100%, and may make it possible to maximize a sensitivity.

Although embodiments may be described with respect to a complementary metal oxide semiconductor (CMOS) image sensor (CIS), embodiments may not be limited to a CIS. According to embodiments, any image sensor requiring a photodiode may be used.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method, comprising:
providing a first substrate;
forming circuitry including a metal interconnection over the first substrate;
forming a photodiode in a crystalline semiconductor layer of a second substrate;
forming an ion implantation isolation layer in the photodiode;
bonding the first substrate to the second substrate to connect the photodiode to the metal interconnection; and
removing a lower portion of the second substrate to expose the photodiode,
wherein forming the photodiode comprises:
forming a second conduction type conduction layer in the crystalline semiconductor layer; and
forming a first conduction type conduction layer over the second conduction type conduction layer,
wherein forming the ion implantation isolation layer in the photodiode comprises forming a second conduction type first ion implantation isolation layer over the first conduction type conduction layer,
wherein forming the ion implantation isolation layer in the photodiode comprises forming a second conduction type second ion implantation isolation layer at an interface between pixels of the photodiode.

2. The method of claim 1, comprising forming the second conduction type conduction layer at a junction depth of less than approximately 0.5 µm.

3. The method of claim 1, comprising forming the first conduction type conduction layer at a junction depth ranging from approximately 1.0 µm to 2.0 µm.

4. The method of claim 1, comprising forming the ion implantation isolation layer over at least one of a side of the photodiode and a bottom of the photodiode.

5. The method of claim 1, wherein the ion implantation isolation layer comprises a P0 layer.

6. The method of claim 1, comprising:
forming a dielectric over the photodiode of the second substrate before bonding the first and second substrates; and
forming a metal pad in the dielectric.

7. The method of claim 1, wherein bonding the first substrate to the second substrate comprises contacting the first substrate and the second substrate with each other and performing activation by plasma.

8. The method of claim 1, wherein forming the circuitry including the metal interconnection comprises forming a metal and a plug over the first substrate.

9. The method of claim 1, wherein the second conduction type second ion implantation isolation layer is disposed to directly contact on a top surface of the second conduction type first ion implantation isolation layer and a bottom surface of the second conduction type conduction layer.

* * * * *